(12) United States Patent
Lee

(10) Patent No.: US 7,485,893 B2
(45) Date of Patent: Feb. 3, 2009

(54) DISPLAY DEVICE

(75) Inventor: Chun Tak Lee, Gumi (KR)

(73) Assignee: LG Display Co., Ltd., Seoul (KR)

( * ) Notice: Subject to any disclaimer, the term of this patent is extended or adjusted under 35 U.S.C. 154(b) by 433 days.

(21) Appl. No.: 11/375,002

(22) Filed: Mar. 15, 2006

(65) Prior Publication Data

US 2007/0007554 A1 Jan. 11, 2007

(30) Foreign Application Priority Data

Jul. 8, 2005 (KR) .................. 10-2005-0061624
Jul. 8, 2005 (KR) .................. 10-2005-0061625

(51) Int. Cl.
*H01L 29/08* (2006.01)

(52) U.S. Cl. .................. 257/40; 257/99; 257/E33.064; 257/E51.019

(58) Field of Classification Search .................. 257/40, 257/99, E33.064, E51.019
See application file for complete search history.

(56) References Cited

U.S. PATENT DOCUMENTS 7,064,350 B2 6/2006 Park .......................... 257/72

2005/0008894 A1* 1/2005 Hiruma et al. .............. 428/690
2005/0236972 A1* 10/2005 Park et al. .................... 313/503
2006/0113903 A1* 6/2006 Kim .......................... 313/506
2006/0284555 A1* 12/2006 Lee ............................ 313/512

FOREIGN PATENT DOCUMENTS

KR 10-2005-0068859 A 7/2005

* cited by examiner

*Primary Examiner*—Trung Dang
(74) *Attorney, Agent, or Firm*—Morgan Lewis & Bockius LLP

(57) ABSTRACT

The present invention relates to a display device, such as an organic electroluminescent device, for preventing corrosion of a signal line. A display device according to the present invention, comprising a substrate; a first electrode layer disposed over the substrate; a second electrode layer disposed to cover the first electrode layer and configured to electrically communicate with the first electrode layer; and a pixel disposed over the substrate, wherein a signal line is defined as an electrode layer including the first electrode layer and the second electrode layer, wherein the first electrode layer is in electrical communication with the pixel. The display device according to the present invention can prevent the material of the signal line from being corroded. Also, the device can prevent the reduction of brightness and the increase of power consumption.

16 Claims, 3 Drawing Sheets

Fig. 1 [Related Art]
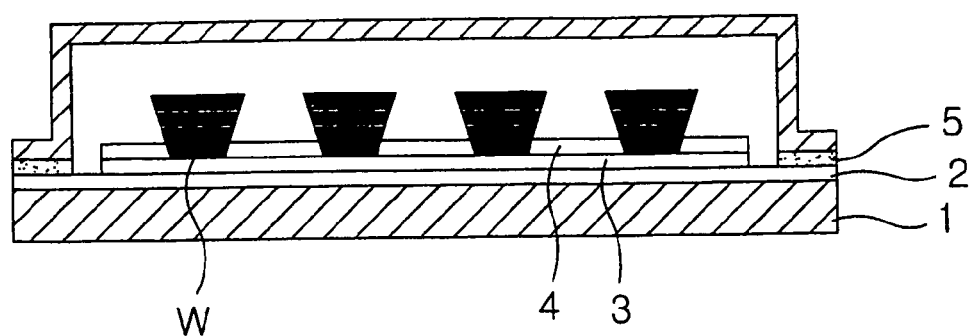
Fig. 2 [Related Art]
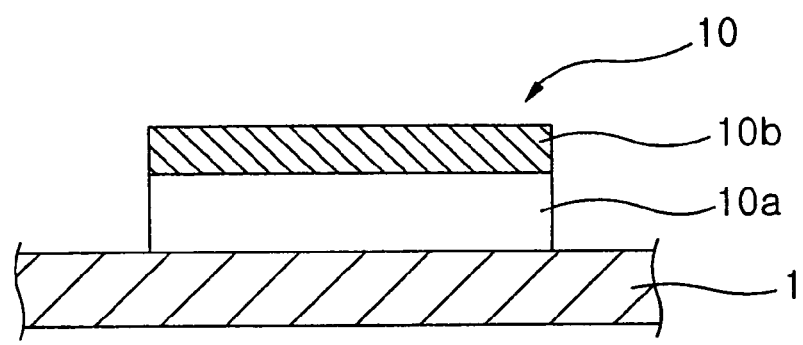

DISPLAY DEVICE

BACKGROUND OF THE INVENTION

1. Field of the Invention

The present invention relates to a display device for preventing corrosion of a signal line. Particularly, the present invention relates to a display device, such as an organic electroluminescent device, for preventing a scan line or a data line from being corroded.

2. Description of the Related Art

An organic electroluminescent device, one of the display devices, is a device using organic electroluminescence. Organic electroluminescence is a phenomenon that excitons are formed in an (low molecular or high molecular) organic material thin film by re-combining holes injected through an anode with electrons injected through a cathode, and a light of specific wavelength is generated by energy of the formed excitons.

FIG. 1 is a cross-sectional view of an organic electroluminescent device of the related art.

As shown in FIG. 1, the organic electroluminescent device comprises an anode electrode layer 2, an insulating layer (not shown), an organic material layer 3 and a cathode electrode layer 4, stacked in order on a glass substrate 1. A wall W is formed on the anode electrode layers 2 for partitioning the cathode electrode layers 4.

The anode electrode layer 2 is coupled to pads (not shown) disposed on an end of the substrate 1 through a data line, and the cathode electrode layer 4 is coupled to the pads through a scan line.

FIG. 2 shows a cross-sectional view of the data line or the scan line of the organic electroluminescent device, in accordance with the related art. Hereinafter, for convenience's sake, the scan line will be exemplified.

The scan line 10 comprises a scan line electrode layer 10a disposed on the substrate 1, and a sub-electrode layer 10b disposed on the scan line electrode layer 10a. Usually, ITO is used for the scan line electrode layer 10a, and molybdenum, which has a lower resistance value than ITO, is used for the sub-electrode layer 10b. Therefore, the overall resistance of the scan line 10 can be reduced.

However, the scan line 10 having a double-layer structure may be corroded by moisture contained in atmosphere or moisture contained in sealant 5. Particularly, galvanic corrosion may occur on the boundary surfaces of the scan line electrode layer 10a and the sub-electrode layer 10b.

The galvanic corrosion occurred on the boundary surfaces of the scan line electrode layer 10a and the sub-electrode layer 10b decreases the brightness of the organic electroluminescent device by increasing a resistance value of the scan line 10, and increases the power consumption of the device such that the entire performance of the device is degenerated.

SUMMARY OF THE INVENTION

An object of the present invention is to provide a display device which can prevent corrosion of a signal line.

A display device according to the present invention, comprising a substrate; a first electrode layer disposed over the substrate; a second electrode layer disposed to cover the first electrode layer and configured to electrically communicate with the first electrode layer; and a pixel disposed over the substrate, wherein a signal line is defined as a structure including the first electrode layer and the second electrode layer, and is in electrical communication with the pixel.

The pixel is preferable to comprise an anode electrode layer disposed over the substrate; a cathode electrode layer disposed over or under the anode electrode layer; and a luminescent layer disposed between the anode electrode layer and the cathode electrode layer. Preferably, the luminescent layer is an organic material layer.

Preferably, the signal line consists of only the first electrode layer in a predetermined area of the signal line, and the first electrode layer of the predetermined area electrically communicates with the pixel.

The display device is preferable to further comprise an insulating layer disposed over the first electrode layer of the predetermined area to cover an end of the second electrode layer.

The second electrode layer is preferable to cover an end of the first electrode layer disposed in the direction of the pixel to electrically communicate with the pixel.

Preferably, the resistance value or the unit resistance value of material, of the first electrode layer is smaller than that of the second electrode layer.

An organic electroluminescent device according to the present invention comprises a substrate; a sub-electrode layer disposed over the substrate; a signal line electrode layer disposed to cover the sub-electrode layer and configured to electrically communicate with the sub-electrode layer; an anode electrode layer disposed over the substrate; a cathode electrode layer disposed over or under the anode electrode layer; and an organic material layer disposed between the anode electrode layer and the cathode electrode layer, wherein a pixel area is defined as an area of the substrate covered by the anode electrode layer, the organic material layer and cathode electrode layer, and wherein a signal line is defined as a structure including the sub-electrode layer and the signal line electrode layer, and is in electrical communication with the cathode electrode layer or the anode electrode layer.

Preferably, the signal line consists of only the sub-electrode layer in a predetermined area of the signal line, and the sub-electrode layer of the predetermined area contacts the cathode electrode layer.

The organic electroluminescent device is preferable to further comprise an insulating layer disposed over the signal electrode layer of the predetermined area, wherein at least one aperture is formed in the insulating layer to expose the sub-electrode layer of the predetermined area, and wherein the exposed sub-electrode layer contacts the cathode electrode layer through the at least one aperture. Also, the organic electroluminescent device is preferable to further comprise an insulating layer disposed over the sub-electrode layer of the predetermined area to cover an end of the signal line electrode layer.

Preferably, The electrical conductivity of the sub-electrode layer is substantially identical with that of the cathode electrode layer.

The signal line electrode layer is preferable to cover an end of the sub-electrode layer disposed in the direction of the pixel area to be in direct contact with the anode electrode layer. Also, the signal line electrode layer and the anode electrode layer are preferable to be formed from same material through same process.

Preferably, the resistance value or the unit resistance value of material, of the sub-electrode layer is smaller than that of the signal line electrode layer.

Preferably, the signal line electrode layer is disposed over the substrate to surround an exposed surface of the sub-electrode layer. Also, the signal line electrode layer is preferable to be disposed to cover the sub-electrode layer along an entire length thereof, or for a part of length thereof.

The display device according to the present invention, described above, can prevent the material of the signal line from being corroded. Also, the device can prevent the reduction of brightness and the increase of power consumption.

BRIEF DESCRIPTION OF THE DRAWING

FIG. 1 is a cross-sectional view of an organic electroluminescent device of the related art.

FIG. 2 is a cross-sectional view of the data line or the scan line of the organic electroluminescent device, in accordance with the related art.

DETAILED DESCRIPTION OF THE INVENTION

Hereinafter, a display device according to the preferred embodiment of the present invention will be explained in more detail with reference to the accompanying drawings. Also, an organic electroluminescent display will be explained for explanation purposes. However, the present invention is not limited to the organic electroluminescent device.

Figure 3:
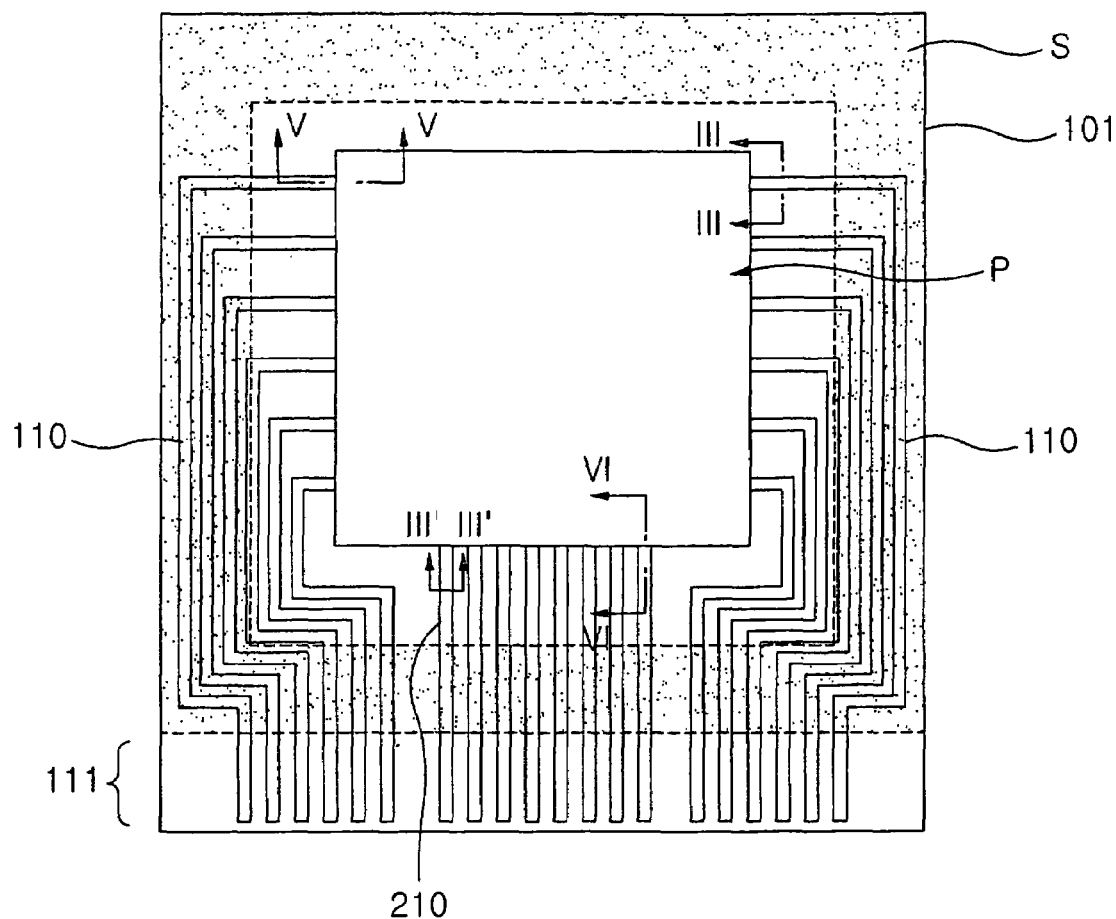
FIG. 3 is a plane view of an organic electroluminescent device according to the preferred embodiment of the present invention.

FIG. 3 is a plane view of the organic electroluminescent device according to the preferred embodiment of the present invention. In FIG. 3, a cap is not illustrated for convenience's sake, and only the area S applied by sealant for attaching the cap to a substrate 101 is illustrated.

Also, a pixel area P is defined as an area on the substrate 101 covered by an anode electrode layer, an organic material layer and a cathode electrode layer. The anode electrode layer, the organic material layer and the cathode electrode layer have already been explained referring to FIG. 1, and thus the explanation for them is omitted.

Although the anode electrode layer has been illustrated as being on the substrate with the cathode electrode layer being above, it would be possible to reverse this orientation for the anode electrode layer and the cathode electrode layer.

A scan line 110 is coupled to the cathode electrode layer of the pixel area P, and a data line 210 is coupled to the anode electrode layer of the pixel area P. Also, each end of the scan line 110 and data line 210 is coupled to pads 111 disposed on an end of the substrate 101.

Figure 4:
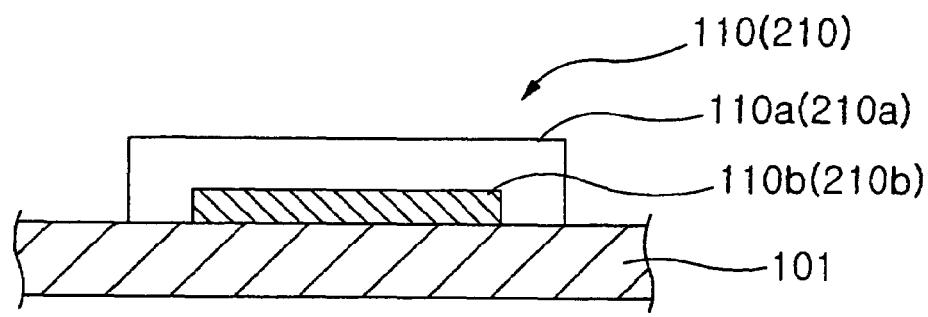
FIG. 4 is a cross-sectional view of a scan line taken along the line III-III of FIG. 3, or a data line taken along the line III'-III' of FIG. 3.

FIG. 4 is a cross-sectional view of the scan line taken along the line III-III of FIG. 3, or the data line taken along the line III'-III' of FIG. 3.

Sub-electrode layers 110b, 210b are disposed over the substrate 101. A scan line electrode layer 110a and a data line electrode 210a are disposed over the substrate 101 to cover the sub-electrode layers 110b, 210b respectively, and configured to electrically communicate with the sub-electrode layers 110b, 210b respectively.

The resistance value of the sub-electrode layer 110b or 210b is lower than that of the scan line electrode layer 110a or the data line electrode layer 210a. Also, the unit resistance value of material of the sub-electrode layers 110b or 210b is lower than that of the scan line electrode layer 110a or the data line electrode layer 210a. Molybdenum or aluminum is preferable as the sub-electrode layers 110b, 210b, and ITO is preferable as the scan line electrode layer 110a and the data line electrode layer 210a.

As shown in FIG. 4, the scan line electrode layer 110a is disposed to completely surround the surface of the sub-electrode layer 110b. Also, the data line electrode layer 210a is disposed to completely surround the surface of the sub-electrode layer 210b. Therefore, the sub-electrode layers 110b, 210b are not exposed to the outside. Also, the scan line electrode layer 110a and the data line electrode layer 210a are preferable to surround the sub-electrode layers 110b, 210b along entire lengths of the sub-electrode layers 110b, 210b respectively.

Hereinafter, a process for forming the scan line 110 and the data line 210 will be explained.

The sub-electrode layers 110b, 210b are formed over an area where the scan line 110 and data line 210 will be formed, by a sputtering process and the likes. And then, during the process for forming the anode electrode layer in the pixel area P, the scan line electrode layer 110a and the data line electrode layer 210a are formed over the sub-electrode layers 110b, 210b, together with the anode electrode layer. Therefore, the scan line 110 and the data line 210 according to the preferred embodiment of the present invention can be formed without additional processes.

By the scan line 110 and the data line 210 of the organic electroluminescent device, having the structure described above, the following effects can be achieved.

The scan line electrode layer 110a and the data line electrode layer 210a are formed over the sub-electrode layers 110b, 210b not to make the sub-electrode layers 110b, 210b exposed such that moisture contained in atmosphere or moisture contained in sealant does not directly contact the sub-electrode layers 110b, 210b. Therefore, the sub-electrode layers 110b, 210b are not corroded.

Also, because the scan line 110 and the data line 210 of the organic electroluminescent device according to the present invention have the structure where the sub-electrode layers 110b, 210b are not exposed to the outside by the scan line electrode layer 110a and the data line electrode layer 210a, the boundary surfaces of the sub-electrode layer 110b and the scan line electrode layer 110a, and of the sub-electrode layer 210b and the data line electrode layer 210a are not exposed to the moisture. Therefore, galvanic corrosion does not break out on the boundary surface.

Preferably, the structure illustrated in FIG. 4 is configured to expose a portion of the sub-electrode 110b of the scan line 110 to the outside of the scan line electrode layer 110a within the area where the scan line 110 is connected to the cathode electrode layer of the pixel area P.

Figure 5:
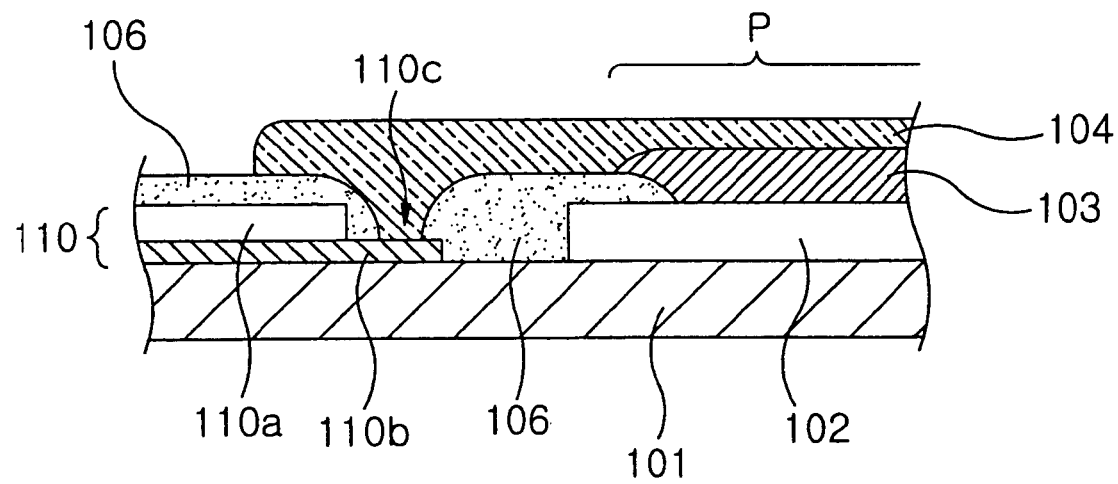
FIG. 5 is a cross-sectional view of the scan line taken along the line V-V of FIG. 3.

FIG. 5 is a cross-sectional view of the scan line taken along the line V-V of FIG. 3.

First, the sub-electrode layer 110b is formed in the area where the scan line 110 will be formed. And then, the anode electrode layer 102 is formed in the pixel area P. The scan line electrode layer 110a is formed together with the anode electrode layer 102 of the pixel area P. Here, the scan line electrode layer 110a is formed in the way that the end of the sub-electrode layer 110b, facing the pixel area P, is exposed.

And then the insulating layer 106 is selectively formed to cover a portion of the anode electrode layer 102 and the scan line 110. Here, a part of the sub-electrode layer 110c is exposed through an aperture formed in the insulating layer 106.

Then, an organic material layer 103 is selectively formed over the anode electrode layer 102 and the insulating layer 106.

Then, the cathode electrode layer 104 is selectively formed over the organic material layer 103, the insulating layer 106 and the part of the sub-electrode layer 110c. Therefore, the part of sub-electrode layer 110c directly contacts the cathode electrode layer 104. Preferably, the electrical conductivities of the sub-electrode layer 110b and the cathode electrode layer 104 are substantially the same. Therefore, the contact resistance between the sub-electrode layer 110b and the cathode electrode layer 104 can be reduced.

The structure where the part of the sub-electrode layer 110c directly contacts the cathode electrode layer 104 prevents the cathode electrode layer 104 from directly contacting the scan line electrode layer 110a. Therefore, the galvanic corrosion between the cathode electrode layer 104, which is made of metal, and the scan line electrode layer 110a, which is made of ITO, can be prevented.

Figure 6:
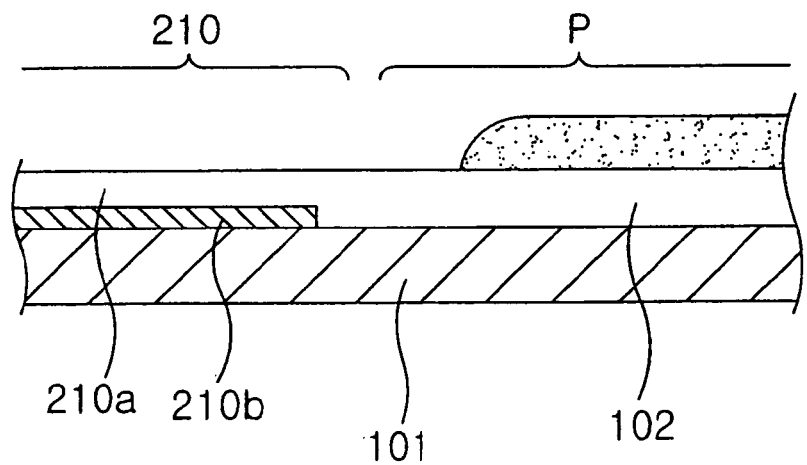
FIG. 6 is a cross-sectional view of the data line taken along the line VI-VI of FIG. 3.

FIG. 6 is a cross-sectional view of the data line taken along the line VI-VI of FIG. 3.

As shown in FIG. 6, in the data line 210, it is not needed that the sub-electrode layer 210b is exposed at an end thereof. Because the data line 210 which is made of the same material as the anode electrode layer 102, directly contacts the anode electrode layer 102, the sub-electrode layer 210b is not exposed.

From the above preferred embodiments for the present invention, it is noted that modifications and variations can be made by a person skilled in the art in light of the above teachings. Therefore, it should be understood that changes may be made for a particular embodiment of the present invention within the scope and the spirit of the present invention outlined by the appended claims.

What is claimed is:

1. An organic electroluminescent device, comprising:
   a substrate;
   a sub-electrode layer disposed over the substrate;
   a signal line electrode layer disposed to cover the sub-electrode layer and configured to electrically communicate with the sub-electrode layer;
   an insulating layer disposed over the sub-electrode layer;
   an anode electrode layer disposed over the substrate;
   a cathode electrode layer disposed over or under the anode electrode layer; and
   an organic material layer disposed between the anode electrode layer and the cathode electrode layer,
   wherein a pixel area is defined as an area of the substrate covered by the anode electrode layer, the organic material layer and cathode electrode layer,
   wherein a signal line is defined as a structure including the sub-electrode layer and the signal line electrode layer, and is in electrical communication with the cathode electrode layer or the anode electrode layer,
   wherein the signal line consists of only the sub-electrode layer in a predetermined area of the signal line,
   wherein the sub-electrode layer of the predetermined area contacts the cathode electrode layer, and
   wherein the insulating layer disposed over the sub-electrode layer of the predetermined area to cover an end of the signal line electrode layer.

2. The organic electroluminescent device of claim 1, further comprising:
   an insulating layer disposed over the signal electrode layer of the predetermined area,
   wherein at least one aperture is formed in the insulating layer to expose the sub-electrode layer of the predetermined area, and
   wherein the exposed sub-electrode layer contacts the cathode electrode layer through the at least one aperture.

3. The organic electroluminescent device of claim 1, wherein the electrical conductivity of the sub-electrode layer is substantially identical with that of the cathode electrode layer.

4. The organic electroluminescent device of claim 1, wherein the signal line electrode layer covers an end of the sub-electrode layer disposed in the direction of the pixel area to be in direct contact with the electrode layer.

5. The organic electroluminescent device of claim 1, wherein the resistance value of the sub-electrode layer is smaller than that of the signal line electrode layer.

6. The organic electroluminescent device of claim 1, wherein the unit resistance value of material of the sub-electrode is smaller than that of the signal line electrode layer.

7. The organic electroluminescent device of claim 1, wherein the signal line electrode layer and the anode electrode layer are formed from same material through same process.

8. The organic electroluminescent device of claim 1, wherein the signal line electrode layer is disposed over the substrate to surround an exposed surface of the sub-electrode layer.

9. The organic electroluminescent device of claim 1, wherein the signal line electrode layer is disposed to cover the sub-electrode layer along an entire length thereof.

10. The organic electroluminescent device of claim 1, wherein the signal line electrode layer is disposed to cover the sub-electrode layer for a part of length thereof.

11. A display device, comprising:
    a substrate;
    a first electrode layer disposed over the substrate;
    a second electrode layer disposed to cover the first electrode layer and configured to electrically communicate with the first electrode layer;
    an insulating layer disposed over the first electrode layer; and
    a pixel area over the substrate,
    wherein a signal line is defined as a structure including the first electrode layer and the second electrode layer, and is in electrical communication with the pixel,
    wherein the signal line consists of only the first electrode layer in a predetermined area of the signal line,
    wherein the first electrode layer of the predetermined area electrically communicates with the pixel, and
    wherein the insulating layer disposed over the first electrode layer of the predetermined area to cover an end of the second electrode layer.

12. The display device of claim 11, wherein the resistance value of the first electrode layer is smaller than that of the second electrode layer.

13. The display device of claim 11, wherein the unit resistance value of material of the first electrode is smaller than that of the second electrode layer.

14. The display device of claim 11, wherein the second electrode layer covers an end of the first electrode layer disposed in a direction of the pixel to electrically communicate with pixel.

15. The display device of claim 11, wherein the pixel comprises:
    an anode electrode layer disposed over the substrate;

a cathode electrode layer disposed over or under the anode electrode layer; and a luminescent layer disposed between the anode electrode layer and the cathode electrode layer.

16. The display device of claim 15, wherein the luminescent layer is an organic material layer.

* * * * *